US008709876B2

(12) United States Patent
Schneegans et al.

(10) Patent No.: US 8,709,876 B2

(45) Date of Patent: Apr. 29, 2014

(54) ELECTRONIC DEVICE

(75) Inventors: Manfred Schneegans, Vaterstetten (DE); Holger Torwesten, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 30 days.

(21) Appl. No.: 13/610,268

(22) Filed: Sep. 11, 2012

(65) Prior Publication Data

US 2013/0005144 A1 Jan. 3, 2013

Related U.S. Application Data

(62) Division of application No. 11/876,271, filed on Oct. 22, 2007, now Pat. No. 8,264,072.

(51) Int. Cl.
*H01L 21/00* (2006.01)

(52) U.S. Cl.
USPC ........................................... 438/123; 257/676

(58) Field of Classification Search
USPC ........................................... 438/123; 257/676
See application file for complete search history.

(56) References Cited

U.S. PATENT DOCUMENTS

| | | | |
|---|---|---|---|
| 3,761,309 A | 9/1973 | Schmitter et al. |
| 5,821,605 A | 10/1998 | Hong et al. |
| 5,872,404 A | 2/1999 | Lynch et al. |
| 6,114,243 A | 9/2000 | Gupta |
| 6,221,692 B1 | 4/2001 | Shoji et al. |
| 6,294,463 B1 | 9/2001 | Tseng |
| 6,630,387 B2 | 10/2003 | Horii |
| 6,856,011 B2 | 2/2005 | Choi |
| 7,098,133 B2 | 8/2006 | Kim |
| 2001/0000416 A1 | 4/2001 | Uzoh |
| 2001/0027008 A1 | 10/2001 | Matsumoto |
| 2001/0040290 A1 | 11/2001 | Sakurai et al. |
| 2002/0070438 A1 | 6/2002 | Ference et al. |
| 2004/0104456 A1 | 6/2004 | Duffy et al. |
| 2005/0258484 A1 | 11/2005 | Itou |
| 2007/0077761 A1 | 4/2007 | Lehr et al. |
| 2007/0181993 A1 | 8/2007 | Choi et al. |
| 2007/0259522 A1 | 11/2007 | Arai et al. |

OTHER PUBLICATIONS

Notice of Allowance mailed May 11, 2012 in U.S. Appl. No. 11/876,271.
Office Action mailed Mar. 15, 2011 in U.S. Appl. No. 11/876,271.
Final Office Action mailed May 25, 2010 in U.S. Appl. No. 11/876,271.
Office Action mailed Nov. 9, 2009 in U.S. Appl. No. 11/876,271.

*Primary Examiner* — Anthony Ho

(74) *Attorney, Agent, or Firm* — Dicke, Billig & Czaja, PLLC

(57) ABSTRACT

An electronic device is disclosed. In one embodiment, the electronic device includes a substrate, a plurality of conducting lines formed on a first conducting material that is disposed on the substrate, and a layer of a second conducting material disposed on the plurality of conducting lines. The conducting lines include a top face and a side face. The layer of the second conducting material includes a first thickness disposed on each of the top faces and a second thickness disposed on each of the side faces. To this end, the first thickness is greater than the second thickness.

12 Claims, 7 Drawing Sheets

ELECTRONIC DEVICE

CROSS-REFERENCE TO RELATED APPLICATIONS

This Utility Patent Application is a divisional application of U.S. application Ser. No. 11/876,271, filed Oct. 22, 2007, which is incorporated herein by reference.

BACKGROUND

Market demand for smaller, lighter, and more powerful electronic devices has driven the development of more compact packages having increased functionality. The market demand has spurred semiconductor packaging technologies in the areas of fine pitch ball grid arrays (FBGA), chip-scale packages (CSP), wafer-level packaging (WLP), multi-chip module (MCM) technology, and stacked die packaging. MCM technologies provide multiple semiconductor chips functionally assembled in one package, such as multiple stacked die in a CSP or multiple stacked die on a BGA.

A die package includes one or more semiconductor chips mounted to a carrier and electrical connectors attached between the carrier and the chip. The electrical connectors include wires, clips, etc., that electrically connect the chip to other electronic devices. Ball bonding is one way of bonding the electrical connectors to conducting lines of the chip. Ball bonding uses a combination of heat, pressure, and ultrasonic energy to weld the connectors onto the chip.

Copper electrical connectors are relatively inexpensive and have superior electrical properties compared to gold or aluminum connectors. However, the melting point of copper is about 1083 degrees Celsius, such that high temperatures and force are used during copper ball bonding. The high force applied during connection of the connector to a copper conducting line of the chip has the potential to damage the chip. For this reason, ball bonding a copper connector to a top surface of a chip presents challenges. In addition, copper is highly susceptible to oxidation, which undesirably reduces the electrical performance of the copper connecting lines. One approach includes purging the atmosphere near the bond site with an inert gas (e.g., nitrogen) to minimize the oxidation of the copper during bonding. Inert gas purging during the electrical connection process is an expensive and an undesirable extra step.

For these and other reasons there is a need for the present invention.

SUMMARY

One aspect provides an electronic device. The electronic device includes a substrate, a plurality of conducting lines formed on a first conducting material that is disposed on the substrate, and a layer of a second conducting material disposed on the plurality of conducting lines. The conducting lines include a top face and a side face. The layer of the second conducting material includes a first thickness disposed on each of the top faces and a second thickness disposed on each of the side faces. To this end, the first thickness is greater than the second thickness.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as “top,” “bottom,” “front,” “back,” “leading,” “trailing,” etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise. As employed in this Specification, the term “electrically coupled” is not meant to mean that the elements must be directly coupled together; intervening elements may be provided between the “electrically coupled” elements.

An electronic device is provided that includes conducting lines having a side wall protection layer. In one embodiment, the conducting lines are formed of copper and include a nickel alloy protection layer deposited on side walls and a top surface of the conducting lines. In other embodiments, the conducting lines are substantially surrounded by nickel material as provided by a nickel seed layer on a bottom surface of the conducting lines and a second conducting layer coating the side walls and a top surface of the conducting lines. In one embodiment, a protection layer is coated on the conducting lines in situ to cover a top surface and side faces of each of the conducting lines.

Embodiments provide a hardened or hard top layer coating for conducting lines and a side wall protection layer that is thinner than the hard top layer. The hard top layer enables wire bonding to a top of the conducting line. The thin side wall protection layer is light-weight and covers the conducting lines, thus providing resistance to undesirable oxidative corrosion of the copper conducting line. Other embodiments provide a relatively thin side wall protection layer that is selectively sized to minimize wafer bowing and the possibility of the side walls cracking as the conducting line is thermally cycled.

Figure 1:
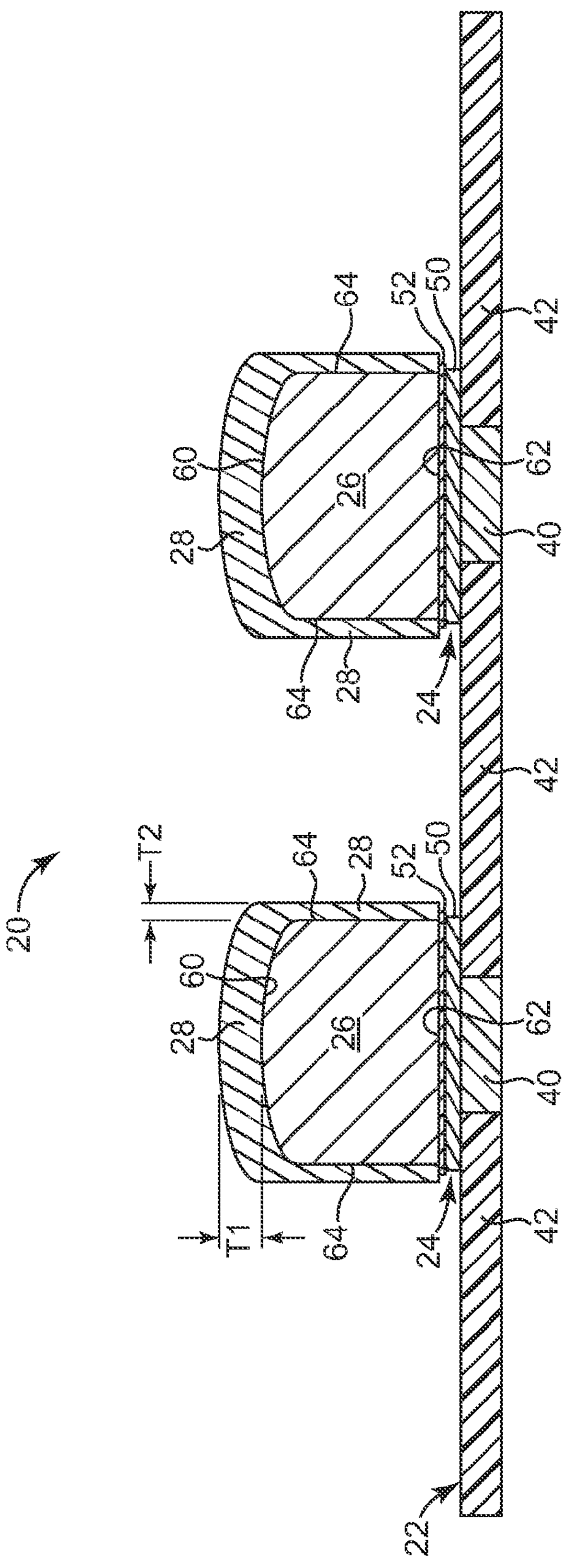
FIG. 1 is a cross-sectional view of an electronic device including a plurality of conducting lines according to one embodiment.

FIG. 1 is a cross-sectional view of an electronic device 20 according to one embodiment. Electronic device 20 includes a substrate 22, a first layer 24 of a conducting material disposed on substrate 22, a plurality of conducting lines 26 disposed on layer 24, and a second layer 28 of a second conducting material disposed on the plurality of conducting lines 26. In one embodiment, the conducting lines 26 are fabricated from copper having desirable electrical properties, but the copper is susceptible to oxidation or other undesirable reactions in the presence of oxygen, and second layer 28 is provided to protect the conducting lines 26 from oxidation.

In one embodiment, electronic device 20 includes semiconductor devices in general, such as memory devices, logic devices, semiconductor chips, semiconductor packages including one or more chips mounted to a carrier, or transistors and the like.

In one embodiment, substrate 22 includes a semiconductor wafer substrate having one or more levels of metallization. For example, in one embodiment substrate 22 includes metal material 40 patterned in passivation material 42, where metal material 40 is configured to provide an electrical path through the layers of substrate 22. In one embodiment, metal material 40 includes aluminum, alloys of aluminum, copper, alloys of copper, or other suitable conducting materials. In one embodiment, passivation material 42 includes silicon, silicon oxide, silicon nitride, or other compounds suitable for use in a semiconductor wafer.

In one embodiment, first layer 24 of conducting material includes a barrier layer 50 deposited on metal material 40, and a seed layer 52 deposited on barrier layer 50. In one embodiment, barrier layer 50 includes titanium, alloys of titanium, tungsten, alloys of tungsten, or other conductive materials suited for use in semiconductor devices. In one embodiment, seed layer 52 includes copper, alloys of copper, nickel, alloys of nickel, or other conductive seed materials suited for use in semiconductor devices.

In one embodiment, first layer 24 is deposited onto substrate 22 by a suitable deposition process such as a plasma vapor deposition (PVD) process. For example, in one embodiment first layer 24 includes a TiW barrier layer 50 that is PVD deposited onto substrate 22, and a nickel seed layer 52 or a copper seed layer 52 that is sputter coated onto barrier layer 50. Other suitable processes for depositing barrier layer 50 and seed layer 52 onto substrate 22 are also acceptable, including plasma deposition, vapor deposition, and/or enhanced deposition processes, etc.

Conducting lines 26 include a suitable metal such as copper or other conductor, although other metals and other conductors are also acceptable. In one embodiment, conducting lines 26 define a top surface 60 opposite a bottom surface 62 and side faces 64 extending between top surface 60 and bottom surface 62. Conducting lines 26 provide an electrical pathway for electrically coupling device 20 to the outside world and include word lines, bit lines, and/or word/bit lines. In one embodiment, conducting lines 26 have a lateral dimension between opposing side faces 64 ranging from about 20-150 micrometers. In one embodiment, conducting lines 26 have a height between top surface 60 and bottom surface 62 from ranging from about 6-30 micrometers, such that a distance between the substrate 22 and the top face 60 is greater than about 6 micrometers.

In some embodiments, it is desirable to wire bond a copper connector (not shown) to conducting lines 26 when electrically coupling device 20. However, wire bonding connectors, and especially wire bonding copper connectors, necessitates the use of a substantial bonding force that has the potential to deform or damage the conducting lines 26 and/or transistors beneath conducting lines 26. Second layer 28 is deposited over conducting lines 26 to provide a hard top surface suited for electrical connection and a side wall protection layer that minimizes the occurrence of undesirable oxidative reactions to conducting lines 26.

In one embodiment, second layer 28 includes a conducting material having a first thickness T1 disposed on the top surface 60 of each conducting line 26 and a second thickness T2 disposed on each of the side faces 64. In one embodiment, the first thickness T1 is greater than the second thickness T2. In some embodiments, the first thickness T1 is a factor between 2-50 times greater than the second thickness T2. One embodiment provides T1 being at least five times greater than the second thickness T2. In one exemplary embodiment, the thickness T2 is between about 0.1-1.0 micrometers and provides a thin side wall protection layer for conducting lines 26, and the thickness T1 is thicker than T2, for example between about 1-5 micrometers, in a manner that provides a hard top to conducting lines 26.

In one embodiment, second layer 28 of conducting material includes nickel, alloys of nickel, palladium, alloys of palladium, platinum, alloys of platinum, or other suitable material. In one embodiment, second layer 28 is selected to be a metal that is harder than copper, for example, second layer 28 includes pure nickel. In another embodiment, second layer 28 includes nickel palladium (NiPd). In another embodiment, second layer 28 of conducting material includes nickel platinum (NiPt).

In one embodiment, device 20 includes a semiconductor package. Device/package 20 includes a wafer level package or a package having carrier such as a leadframe. The leadframe includes a quad flat leadframe, a dual small outline leadframe, and a thin shrink small outline leadframe. In one embodiment, metal material 40 includes an upper level of a chip such that the chip is attached to the carrier and includes a chip substrate 22, a first conducting material 24 disposed on the chip substrate 22, at least one conducting line 26 formed on the first conducting material 24, where each conducting line 26 includes a top face 60 and a side face 64, a layer 28 of a second conducting material disposed on the conducting line 26. It is desired that layer 28 includes a first thickness T1 that is greater than second thickness T2.

FIGS. 2-8 provide an exemplary process for the fabrication of an electronic device according to the embodiments herein.

Figure 2:
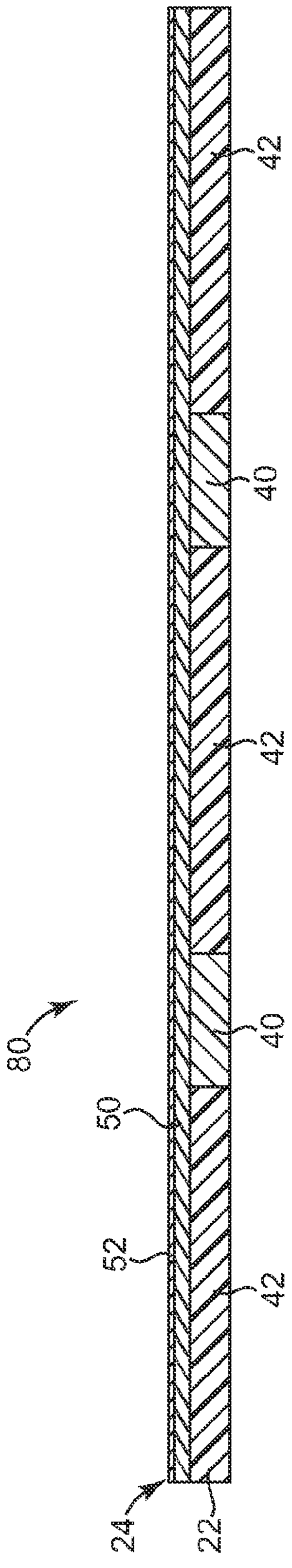
FIG. 2 is a cross-sectional view of a wafer including a substrate and a first conducting material deposited on the substrate according to one embodiment.

FIG. 2 is a cross-sectional view of a semiconductor wafer 80 including substrate 22 and first layer 24 of conducting material deposited on substrate 22. In one embodiment, wafer 80 is a semiconductor wafer and substrate 22 includes multiple levels of metalized layers including metal material 40 patterned in passivation material 42. In one embodiment, metal material 40 includes aluminum or copper, although other metals are also acceptable. In one embodiment, passivation material 42 is a silicon oxide or a silicon nitride material surrounding metal material 40. In other embodiments, passivation material 42 includes multiple layers of silicon oxide and silicon nitride.

In one embodiment, first layer 24 includes barrier layer 50 that includes TiW sputtered onto substrate 22 and seed layer 52 that includes a metal sputtered onto barrier layer 50. In one embodiment, barrier layer 50 is TiW and seed layer 52 includes a nickel seed layer or a copper seed layer.

Figure 3:
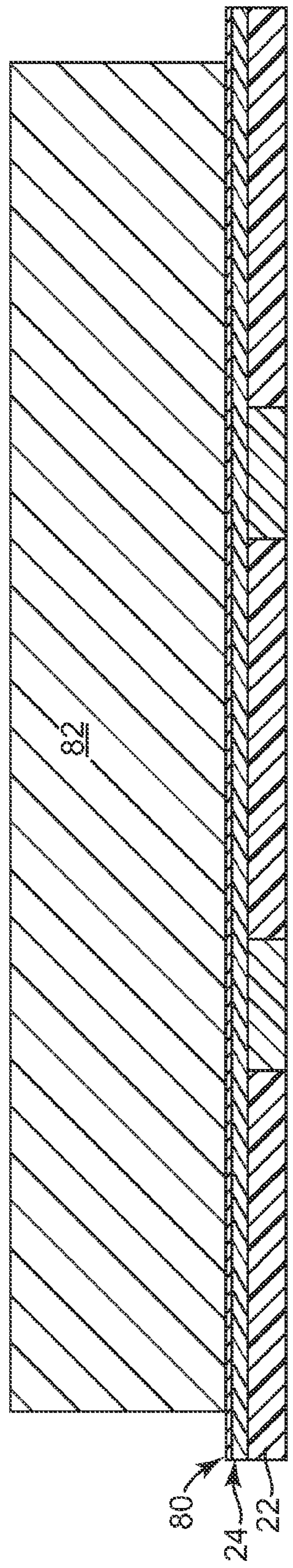
FIG. 3 is a cross-sectional view of the wafer shown in FIG. 2 including a layer of resist material deposited on the first conducting material.

FIG. 3 is a cross-sectional view of a resist material 82 deposited onto wafer 80. In one embodiment, resist material 82 is a photoresist including a positive photoresist or a negative photoresist. In one embodiment, resist material 82 is a positive photoresist in which the portion of the photoresist that is exposed to light becomes soluble to a photoresist developer, and a portion of the photoresist that is not exposed (e.g., is masked) remains insoluble to the photoresist developer. In another embodiment, resist material 82 is a negative photoresist in which the portion of the photoresist that is exposed to light becomes relatively insoluble to the photoresist developer, and the unexposed portion of the photoresist (the masked portion) is dissolved by the photoresist developer. Resist material 82 includes any suitable photolithographically active resist material.

Figure 4:
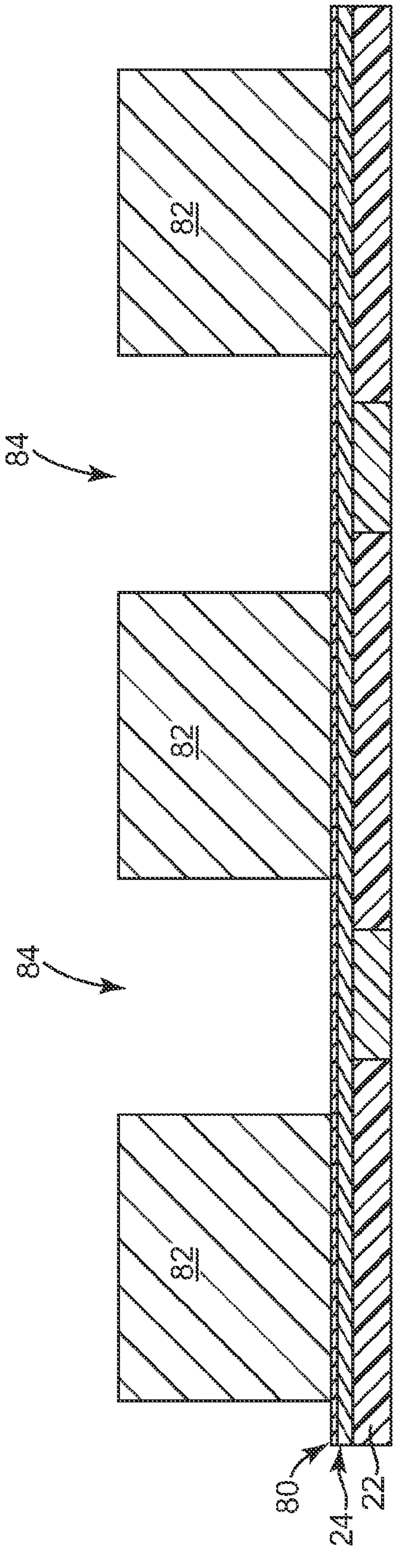
FIG. 4 is a cross-sectional view of the resist layer shown in FIG. 3 after the resist layer is opened by a lithographic process according to one embodiment.

FIG. 4 is a cross-sectional view of the resist material 82 shown in FIG. 3 after pattern opening by a lithographic process. For example, in one embodiment a mask (not shown) is deposited on resist material 82 and the resist material is photolithographically processed. Subsequently, the mask and a portion of the resist material 82 is washed away to define trenches 84 (or openings 84) in the remaining portions of resist material 82, as shown in FIG. 4. In other words, resist material 82 has been patterned open by a lithographic process to define trenches 84 in resist material 82 that communicate with first conducting layer 24.

Figure 5:
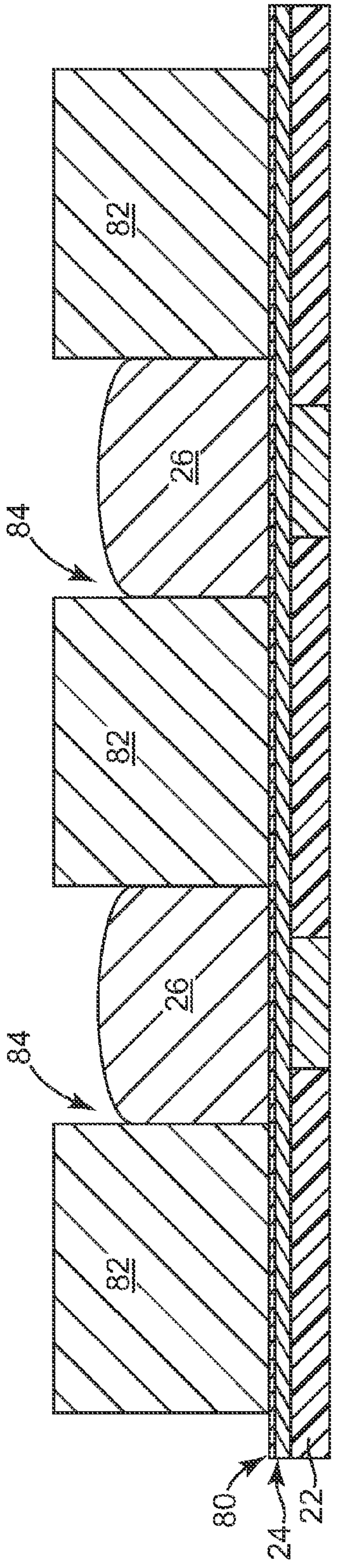
FIG. 5 is a cross-sectional view of a plurality of conducting lines formed on the first conducting material in open regions of the resist material as shown in FIG. 4.

FIG. 5 is a cross-sectional view of a plurality of conducting lines 26 deposited on first layer 24 of conducting material within trenches 84 formed by the remaining portions of resist material 82. In one embodiment, the conducting lines 26 include copper that is electroplated on first layer 24 of conducting material. For example, in one embodiment layer 24 includes a first metallic conductor (for example barrier layer 50 of TiW as shown in FIG. 2) that provides an electrode configured to provide an electrical potential to enable the electroplating of copper conducting lines 26 onto barrier layer 50 and seed layer 52 (FIG. 2). Other deposition processes for depositing copper material onto first layer 24 to define a plurality of conducting lines 26 is also acceptable.

Figure 6:
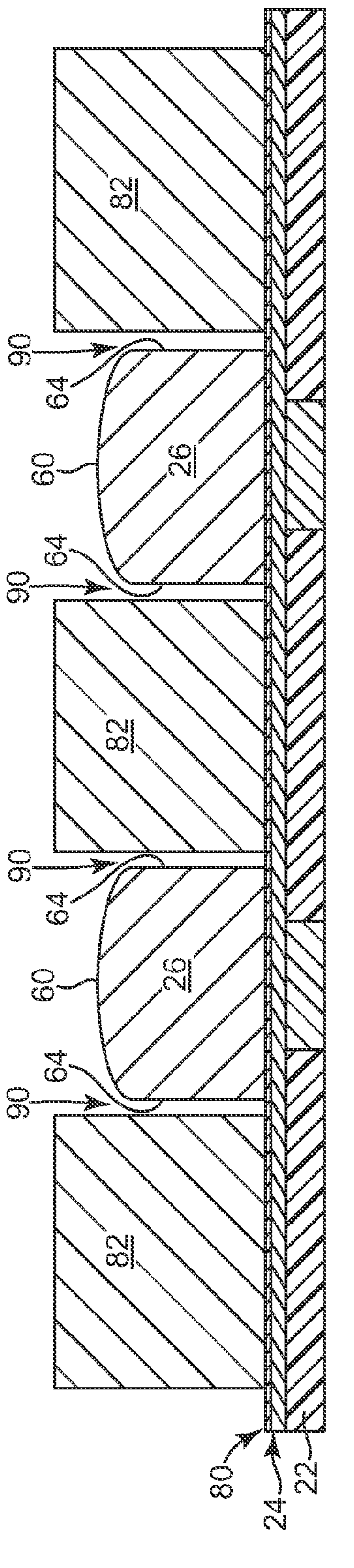
FIG. 6 is a cross-sectional view of a recess formed between the conducting lines and the remaining portion of the resist layer according to one embodiment.

FIG. 6 is a cross-sectional view of resist material 82 after a recess/removal process according to one embodiment. In one embodiment, resist material 82 is exposed to a wet chemistry removal process that is configured to remove a portion of resist material 82 to define recesses 90 between resist material 82 and conducting lines 26. In one embodiment, resist material 82 is exposed to the wet chemistry process for about 1 minute. The wet chemistry recess/removal process uniformly removes a portion of resist material 82 (on the top and sides of resist material 82) in a manner that forms recesses 90 between conducting lines 26 and resist material 82. In one embodiment, the recesses 90 have a lateral dimension of between about 0.1 to 1.0 micrometers. Recesses 90 define an opening that extends between conducting lines 26 and resist material 82, where conducting lines 26 define top surfaces 60 and side faces 64.

Figure 7:
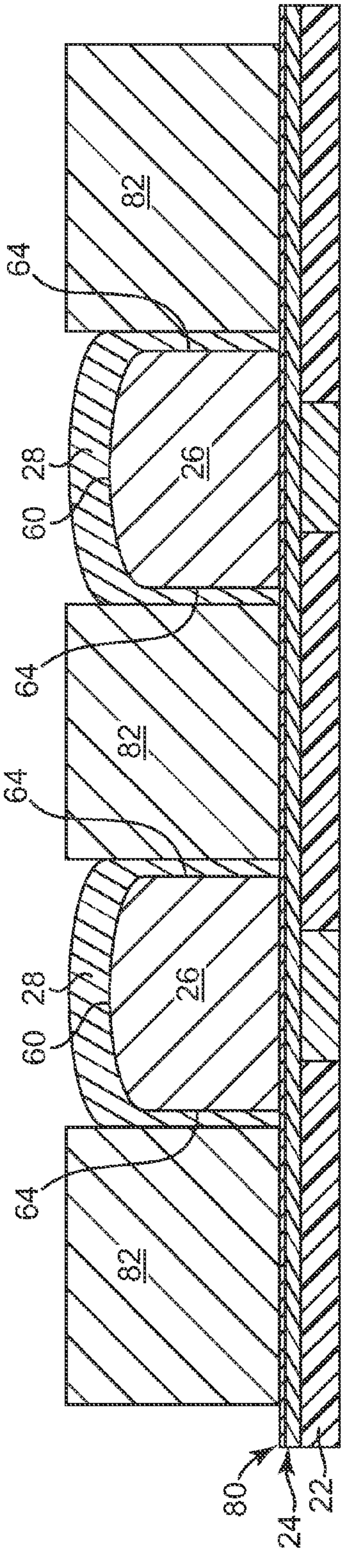
FIG. 7 is a cross-sectional view of a layer of material deposited onto the conducting lines shown in FIG. 6 providing a hard top and side wall protection to the conducting lines.

FIG. 7 is a cross-sectional view of second layer 28 of conducting material deposited onto top surfaces 60 and side faces 64 of conducting lines 26. In one embodiment, second layer 28 of conducting material is deposited into recesses 90 (FIG. 6) to cover substantially an entirety of the copper conducting lines 26. In one embodiment, layer 28 of conducting material is deposited in an electrochemical deposition (ECD) process in which an alloy of nickel is ECD deposited onto conducting lines 26. As described above, second layer 28 includes nickel, NiPd, NiPt, or other suitable alloys of nickel that is conformally coated over conducting lines 26.

In one embodiment, second layer 28 of conducting material is selectively deposited onto top surfaces 60 and side faces 64 of conducting lines 26. The second layer 28 is deposited in and fills recesses 90 (FIG. 6), and the deposition process continues such that the coating of second layer 28 on top surfaces 60 is thicker than the coating of second layer 28 on side faces 64.

Figure 8:
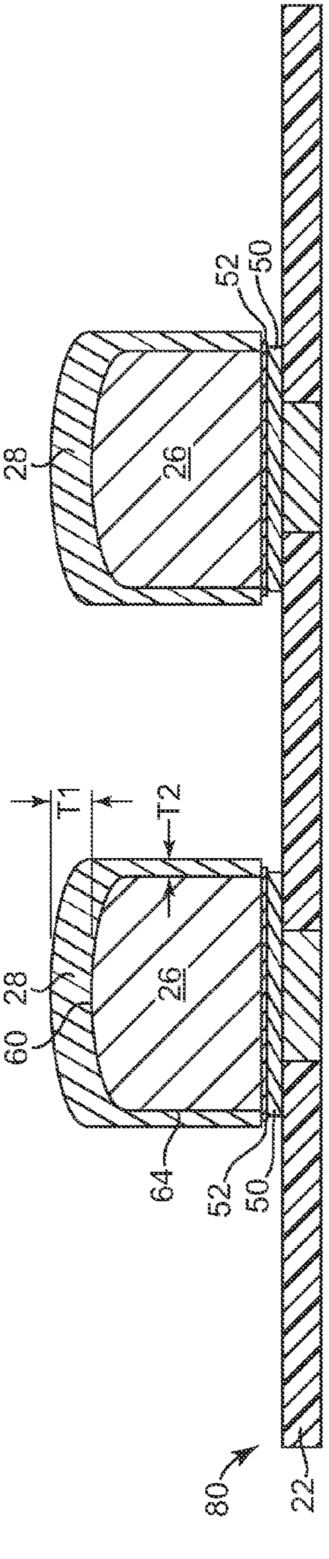
FIG. 8 is a cross-sectional view of coated conducting lines after the resist material shown in FIG. 7 has been removed.

FIG. 8 is a cross-sectional view of conducting lines 26 and second layer 28 of conducting material after etching and removal of resist material 82 (FIG. 7). In one embodiment, the remaining portion of resist material 82 shown in FIG. 7 is removed by a wet chemistry resist removal process, and a portion of first layer 24 is subsequently etched away. For example, in one embodiment resist material 82 (FIG. 7) is removed by a wet chemistry process, a portion of seed layer 52 is etched away and removed, and a portion of barrier layer 50 is under bump metal (UBM) etched, for example by an acid etch process.

In one embodiment, seed layer 52 includes nickel, and second layer 28 of conducting material includes a nickel alloy, such that conducting lines 26 are substantially surrounded by nickel material (layers 52 and 28) as shown in FIG. 8 even after barrier layer 50 and seed layer 52 are undercut etched.

In one embodiment, second layer 28 is coated onto conducting lines 26 to have a first thickness T1 disposed on top surface 60 and a second thickness T2 disposed on side faces 64. In one embodiment, first thickness T1 is greater than second thickness T2. In an exemplary embodiment, first thickness T1 is five or more times greater than the second thickness T2. Wafer 80 includes a plurality of conducting lines 26, and wafer 80 will potentially bow if thickness T2 of conducting material 28 becomes too massive. Side walls 64 of conducting lines 26 include a relatively thin side wall protection layer 28 having a thickness T2 of less than 1 micrometer. It has been discovered that maintaining thickness T2 at a dimension that is less than thickness T1 minimizes deflection or bowing of wafer 80 during semiconductor fabrication. For at least this reason, it is desirable that T2 be less than T1, although other suitable relative thicknesses for T1 and T2 are acceptable.

In one embodiment, conducting lines 26 are formed of copper that defines an electrode that will heat up or increase in temperature during use. Layer 28 of conducting material includes a metal other than copper, for example nickel, which may have a different thermal response than the copper conducting lines 26. Undesirably large dimensions of thickness T2 have the potential to undesirably crack as copper conducting line 26 increases in temperature. In one embodiment, layer 28 of conducting material is conformally coated over conducting lines 26 and includes a coefficient of thermal expansion (CTE) that is configured to match or nearly match a CTE of conducting line 26.

In other embodiments, second layer 28 of conducting material includes nickel that is harder and more brittle than conducting line 26, and thus has a tendency to crack during heating of conducting line 26. To this end, in one embodiment the thickness T2 of material 28 deposited on side walls 64 is selected to be thin (less than about 1 micrometer), thus providing a thickness that minimizes the possibility of crack formation during thermal cycling of conducting lines 26.

In one embodiment, wafer 80 is a semiconductor wafer having multiple semiconductor chips formed throughout its thickness such that substrate 22 includes a chip substrate, layer 24 (FIG. 7) includes a first conducting material disposed on the chip substrate, and at least one of the conducting lines 26 resides on each of the chips. The layer 28 of second conducting material disposed on the conducting line 26 provides sidewall 64 protection against oxidation for conducting line 26 and a hardened surface adjacent to top 60 suited for wire bonding to conducting line 26.

Figure 9:
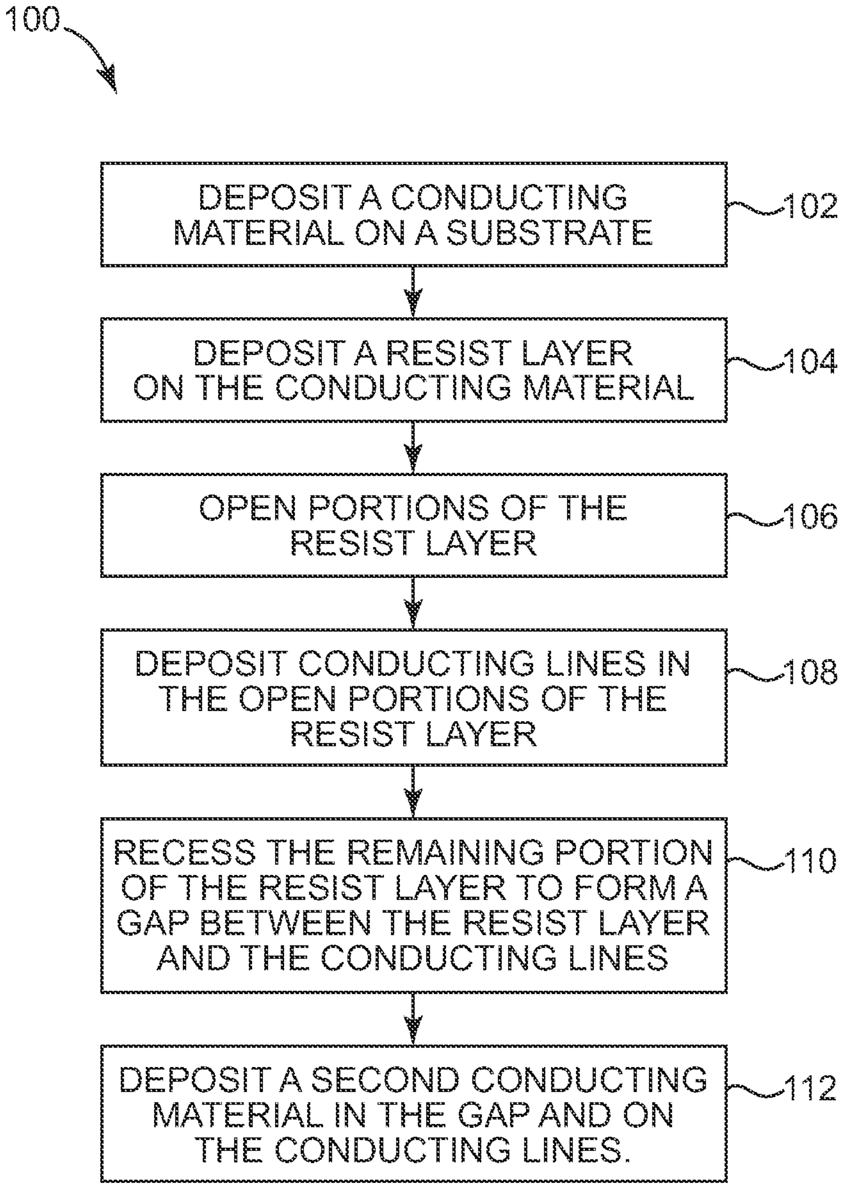
FIG. 9 is a flow chart of a process for fabricating an electronic device including conducting lines having a side wall protection layer according to one embodiment.

FIG. 9 is a flow chart 100 of an exemplary process for fabrication of electronic device 20. In one embodiment, a conducting material is deposited on a substrate at 102, such as layer 24 that is deposited on substrate 22 (FIG. 2). In one embodiment, the conducting material includes layers of conducting materials deposited on a semiconductor substrate, such as wafer 80 as described above in FIG. 2.

Embodiments provide depositing a resist layer on the conducting material at 104 and opening portions of the resist layer at 106, for example as illustrated in FIGS. 3-4. Embodiments provide depositing conducting lines in the open portions of the resist layer at 108, for example as illustrated in FIG. 5. Embodiments provide opening or defining a recess in the remaining portion of the resist layer to form a gap between the resist layer and the conducting lines at 110, for example as illustrated in FIG. 6. Embodiments provide depositing a second conducting material in the gap and on the conducting lines at 112, for example as illustrated in FIG. 7. In one embodiment, second conducting material is deposited in the gap and on the conducting lines at 112 in a one step process, or an in situ process.

An electronic device is provided that includes conducting lines having a side wall protection layer. In one embodiment, the conducting lines are formed of copper and include a nickel alloy protection layer deposited on side walls and a top surface of the conducting lines. In other embodiments, the copper conducting lines are substantially surrounded by nickel material as provided by a nickel seed layer on a bottom surface of the conducting lines and a second conducting layer deposited on the side walls and a top surface of the conducting line. Embodiments provide a side wall protection layer that resists undesirable oxidative corrosion of a copper conducting line and provides a hard top surface suited for receiving copper wire bonded connectors. Other embodiments provide a side wall protection layer that is selectively sized to minimize the possibility of cracking as the conducting line is thermally cycled.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of semiconductor conducting lines having a side wall protection layer. Therefore, it is intended that this invention be limited only by the claims and the equivalents thereof.

What is claimed is:

1. A method of making an electronic device including protecting sidewalls of conducting lines on a semiconductor chip comprising:

providing a semiconductor substrate and a first conducting material disposed on the substrate;

forming a plurality of conducting lines on the first conducting material;

depositing a second conducting material on a top face and on a side face of each of the plurality of conducting lines; and configuring a thickness of the second conducting material deposited on each side face to be less than a thickness of the second conducting material deposited on each top face.

2. The method of claim 1, wherein forming a plurality of conducting lines on the first conducting material comprises:

depositing a resist layer onto the first conducting material;

selectively removing a portion of the resist layer to define a plurality of streets each communicating with a portion of the first conducting material; and depositing a metal conductor line into the plurality of streets.

3. The method of claim 2, wherein depositing a second conducting material on a top face and on a side face of each of the plurality of conducting lines comprises:

removing a remaining portion of the resist layer to define a gap between the resist layer and the metal conductor line deposited into the plurality of streets; and depositing the second conducting material into the gap in contact with the side face of the metal conductor line and on the metal conductor line in contact with the top face.

4. The method of claim 3, wherein configuring a thickness of the second conducting material deposited on each side face to be less than a thickness of the second conducting material deposited on each top face comprises:

removing the remaining portion of the resist layer such that the gap between the resist layer and the metal conductor line is less than a distance between an upper face of the resist layer and the top face of the metal conductor line.

5. The method of claim 3, wherein depositing the second conducting material into the gap in contact with the side face of the metal conductor line and on the metal conductor line in contact with the top face comprises substantially surrounding the metal conductor line with a first conducting material comprising nickel and a second conducting material comprising nickel.

6. A method of making a device including protecting sidewalls of conducting lines on a semiconductor chip comprising:

providing a semiconductor substrate and a first conducting material disposed on the substrate;

forming a plurality of conducting lines on the first conducting material;

depositing a second conducting material having a first thickness on a top face and a second thickness on a side face of each of the plurality of conducting lines; and configuring the second thickness of the second conducting material deposited on each side face to be less than the first thickness of the second conducting material deposited on each top face wherein the first thickness is at least twice the second thickness.

7. The method of claim 6, wherein forming a plurality of conducting lines on the first conducting material comprises:

depositing a resist layer onto the first conducting material;

selectively removing a portion of the resist layer to define a plurality of streets each communicating with a portion of the first conducting material; and depositing a metal conductor line into the plurality of streets.

8. The method of claim 7, wherein depositing a second conducting material on a top face and on a side face of each of the plurality of conducting lines comprises:

removing a remaining portion of the resist layer to define a gap between the resist layer and the metal conductor line deposited into the plurality of streets; and depositing the second conducting material into the gap in contact with the side face of the metal conductor line and on the metal conductor line in contact with the top face.

9. The method of claim 8, wherein configuring a thickness of the second conducting material deposited on each side face to be less than a thickness of the second conducting material deposited on each top face comprises:

removing the remaining portion of the resist layer such that the gap between the resist layer and the metal conductor line is less than a distance between an upper face of the resist layer and the top face of the metal conductor line.

10. The method of claim 8, wherein depositing the second conducting material into the gap in contact with the side face of the metal conductor line and on the metal conductor line in contact with the top face comprises substantially surrounding the metal conductor line with a first conducting material comprising nickel and a second conducting material comprising nickel.

11. The method of claim 6, including defining the second conducting material to have a hardness greater than a hardness of a material from which the plurality of conducting lines are formed.

12. The method of claim 6, including defining the second thickness to be substantially uniform between 0.1 and 1.0 micrometers.

* * * * *